US008845320B2

(12) United States Patent
De Schiffart et al.

(10) Patent No.: US 8,845,320 B2
(45) Date of Patent: *Sep. 30, 2014

(54) IMPRINT LITHOGRAPHY APPARATUS

(75) Inventors: Catharinus De Schiffart, Nijmegen (NL); Andre Bernardus Jeunink, Bergeijk (NL); Johannes Petrus Martinus Bernardus Vermeulen, Helmond (NL); Sander Frederik Wuister, Eindhoven (NL); Yvonne Wendela Kruijt-Stegeman, Eindhoven (NL); Norbert Erwin Therenzo Jansen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 786 days.

This patent is subject to a terminal disclaimer.

(21) Appl. No.: 12/781,225

(22) Filed: May 17, 2010

(65) Prior Publication Data

US 2010/0297282 A1 Nov. 25, 2010

Related U.S. Application Data

(60) Provisional application No. 61/179,623, filed on May 19, 2009.

(51) Int. Cl.
*B29C 59/02* (2006.01)
*G03F 7/00* (2006.01)
*B82Y 10/00* (2011.01)
*B82Y 40/00* (2011.01)
*G03F 9/00* (2006.01)

(52) U.S. Cl.
CPC .......... *G03F 7/0002* (2013.01); *B29C 2059/023* (2013.01); *B82Y 10/00* (2013.01); *B82Y 40/00* (2013.01); *G03F 9/00* (2013.01)
USPC ............................ 425/385; 264/293; 264/496

(58) Field of Classification Search
CPC ... G03F 7/0002; G03F 9/7096; B29C 59/002; B29C 59/02; B29C 59/022; B29C 59/023; B29C 35/0888
USPC .................... 425/385; 264/293, 496; 977/887
See application file for complete search history.

(56) References Cited

U.S. PATENT DOCUMENTS

| 4,731,155 A | 3/1988 | Napoli et al. |
| 5,772,905 A | 6/1998 | Chou |

(Continued)

FOREIGN PATENT DOCUMENTS

| JP | 2004-523906 | 8/2004 |
| JP | 2005-185094 | 7/2005 |

(Continued)

OTHER PUBLICATIONS

J. Haisma et al., "Mold-assisted nanolithography: A process for reliable pattern replication," J. Vac. Sci. Technol. B14(6), Nov./Dec. 1996, pp. 4124-4128.

(Continued)

*Primary Examiner* — Robert J Grun
(74) *Attorney, Agent, or Firm* — Pillsbury Winthrop Shaw Pittman LLP

(57) ABSTRACT

An arrangement suitable for use in an imprint lithography apparatus is disclosed. The arrangement includes a support structure arranged to support an imprint template arrangement, a first actuator configured to apply a force to the imprint template arrangement, and a second actuator attached to the support structure, and arranged in use to extend between the support structure and the imprint template arrangement, the second actuator configured to apply a force to the imprint template arrangement, a range of movement of the second actuator being greater than a range of movement of the first actuator.

20 Claims, 7 Drawing Sheets

(56) References Cited

U.S. PATENT DOCUMENTS

| | | | |
|---|---|---|---|
| 6,334,960 | B1 | 1/2002 | Willson et al. |
| 6,977,461 | B2 | 12/2005 | Hendriks et al. |
| 7,946,837 | B2 | 5/2011 | Kruijt-Stegeman et al. |
| 8,043,085 | B2 | 10/2011 | Kruijt-Stegeman et al. |
| 2003/0081193 | A1* | 5/2003 | White et al. .................... 355/72 |
| 2004/0124566 | A1 | 7/2004 | Sreenivasan et al. |
| 2005/0127786 | A1* | 6/2005 | Hendriks et al. .............. 310/328 |
| 2005/0274693 | A1 | 12/2005 | Heidari et al. |
| 2008/0145774 | A1 | 6/2008 | Kruijt-Stegeman et al. |
| 2009/0108484 | A1 | 4/2009 | Kruijt-Stegeman et al. |
| 2010/0044917 | A1 | 2/2010 | Kruijt-Stegeman et al. |

FOREIGN PATENT DOCUMENTS

| | | |
|---|---|---|
| JP | 2006-165371 | 6/2006 |
| JP | 2007-180178 | 7/2007 |
| JP | 2007-535121 | 11/2007 |
| JP | 2008-098633 | 4/2008 |
| JP | 2009-141328 | 6/2009 |
| JP | 2010-080918 | 4/2010 |
| WO | 02/067055 A2 | 8/2002 |
| WO | WO02067055 * | 8/2002 |

OTHER PUBLICATIONS

Japanese Office Action mailed Feb. 4, 2013 in corresponding Japanese Patent Application No. 2010-109724.

* cited by examiner

IMPRINT LITHOGRAPHY APPARATUS

This application claims priority and benefit under 35 U.S.C. §119(e) to U.S. Provisional Patent Application No. 61/179,623, entitled "Imprint Lithography Apparatus", filed on May 19, 2009. The content of that application is incorporated herein in its entirety by reference.

FIELD

The present invention relates to imprint lithography apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve pressing together a patterned surface of an imprint template and a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable as the patterned surface and the imprintable medium are pressed together. Following patterning of the imprintable medium, the imprintable medium is suitably brought into a non-flowable or "frozen" state and the patterned surface of the imprint template and the patterned imprintable medium are separated. The substrate and patterned imprintable medium are then typically processed further in order to pattern or further pattern the substrate. The imprintable medium is typically formed from resist droplets on the surface of a substrate to be patterned.

In order to accurately and consistently apply a pattern in the imprintable medium, it is sometimes necessary to move or deform the imprint template. The imprint template may be moved or deformed to take into account or compensate for thermal expansion of the imprint template, or for a magnification error, or for another anomaly. In order to move or deform the imprint template, one or more actuators may be disposed around the imprint template. One or more of these actuators may be activated to push against or pull a portion of the imprint template to establish the desired deformation or change in position of the imprint template.

SUMMARY

The imprint template may be moved or deformed directly (e.g. by moving or deforming the imprint template) or indirectly (e.g. by moving or deforming an imprint template holder). Generally speaking, an imprint template may be moved or deformed by moving or deforming an imprint template arrangement, the imprint template arrangement being an imprint template, an imprint template holder, or an imprint template holder that is holding an imprint template.

It is desirable, for example, to provide a new or alternative arrangement, suitable for use in an imprint lithography apparatus, to hold, move or deform an imprint template arrangement.

According to an aspect, there is provided an arrangement suitable for use in an imprint lithography apparatus, the arrangement comprising a support structure arranged to support an imprint template arrangement; a first actuator configured to apply a force to the imprint template arrangement; and a second actuator attached to the support structure, and arranged in use to extend between the support structure and the imprint template arrangement, the second actuator configured to apply a force to the imprint template arrangement, a range of movement of the second actuator being greater than a range of movement of the first actuator.

The imprint template arrangement may be: an imprint template; an imprint template holder, or an imprint template holder that is holding an imprint template.

The first actuator may be attached to the support structure, and arranged in use to extend between the support structure and the imprint template arrangement.

The first actuator and second actuator may be arranged in use to be disposed along at least one side of the imprint template arrangement, and wherein the first actuator and second actuator are disposed alongside each other in a parallel configuration.

The first and/or second actuator may be arranged to apply a force to a peripheral side of the imprint template arrangement.

Another first actuator may be provided on an opposite side of the support structure to meet an opposite side of the imprint template arrangement; and/or another second actuator may be provided on an opposite side of the support structure to meet an opposite side of the imprint template arrangement.

The first actuator may be one of a plurality of first actuators, and/or the second actuator may be one of a plurality of second actuators. The plurality of first actuators and/or second actuators may be located in positions on the support structure which, in use, surround the imprint template arrangement, or extend along one or more sides of the imprint template arrangement.

The first actuator may be one selected from the group comprising: a piezoelectric actuator, a pneumatic actuator, a hydraulic actuator, an electromagnetic actuator, a voice coil, or a screw thread arrangement. The second actuator may be one selected from the group comprising: a piezoelectric actuator, a pneumatic actuator, a hydraulic actuator, an electromagnetic actuator, a voice coil, or a screw thread arrangement.

The support structure may be arranged to surround the imprint template arrangement.

The arrangement may further comprise an actuator positioning arrangement configured to position the first actuator or the second actuator. The actuator positioning arrangement may comprise one or more piezoelectric elements configured to position the first actuator or the second actuator. Alternatively or additionally, the actuator positioning arrangement may comprise a pneumatic actuator, a hydraulic actuator, an electromagnetic actuator, a voice coil, or a screw thread arrangement, to position the first actuator or the second actuator.

According to an aspect, there is provided an arrangement suitable for use in an imprint lithography apparatus, the arrangement comprising: a support structure arranged to support a first imprint template arrangement and a second imprint template arrangement; a first imprint template arrangement actuator attached to the support structure, and arranged in use to extend between the support structure and the first imprint template arrangement, the first imprint template arrangement actuator configured to apply a force to the first imprint template arrangement; and a second imprint template arrangement actuator attached to the support structure, and arranged in use to extend between the support structure and the second imprint template arrangement, the second imprint template arrangement actuator configured to apply a force to the second imprint template arrangement.

One or more actuators may surround the imprint template arrangements, and may all be of the same type and/or may all have the same ranges of motion. In other embodiments, the actuators may comprise one or more actuators of a first type and one or more second actuators of a second type, the range of movement of the second type of actuators being greater than a range of movement of the first type of actuators. The first and second types of actuators may be arranged in parallel or in series. In a series arrangement, the first and second types of actuators may be arranged adjacent to one another in a linear manner. In another embodiment, a first support structure may surround an imprint template arrangement and a first type of actuator may extend between the first support structure and the imprint template arrangement. A second support structure may surround both the first support structure and the imprint template arrangement, and the second type of actuators may extend between the second support structure and the first support structure to form the series arrangement.

The actuators can be any suitable actuators and may be, for example, piezoelectric actuators, magnetic actuators, hydraulic actuators, electromagnetic actuators, voice coils, screw thread arrangements or the like. The actuators may fully or partially surround each respective imprint template arrangement. For instance, the actuators may extend along a single side of the imprint template arrangement, or along opposite sides of an imprint template arrangement.

More than two imprint template arrangements may be supported. Further imprint template arrangement actuators may be attached to the support structure, and arranged in use to extend between the support structure and the additional imprint template arrangements. For example, four imprint template arrangements may be supported.

The imprint template arrangement may be: an imprint template; an imprint template holder, or an imprint template holder that is holding an imprint template.

According to an aspect, there is provided an imprint lithography apparatus comprising any of the arrangements described herein.

BRIEF DESCRIPTION OF THE DRAWINGS

Specific embodiments of the invention will be described with reference to the accompanying figures, in which.

DETAILED DESCRIPTION

Figure 1A:
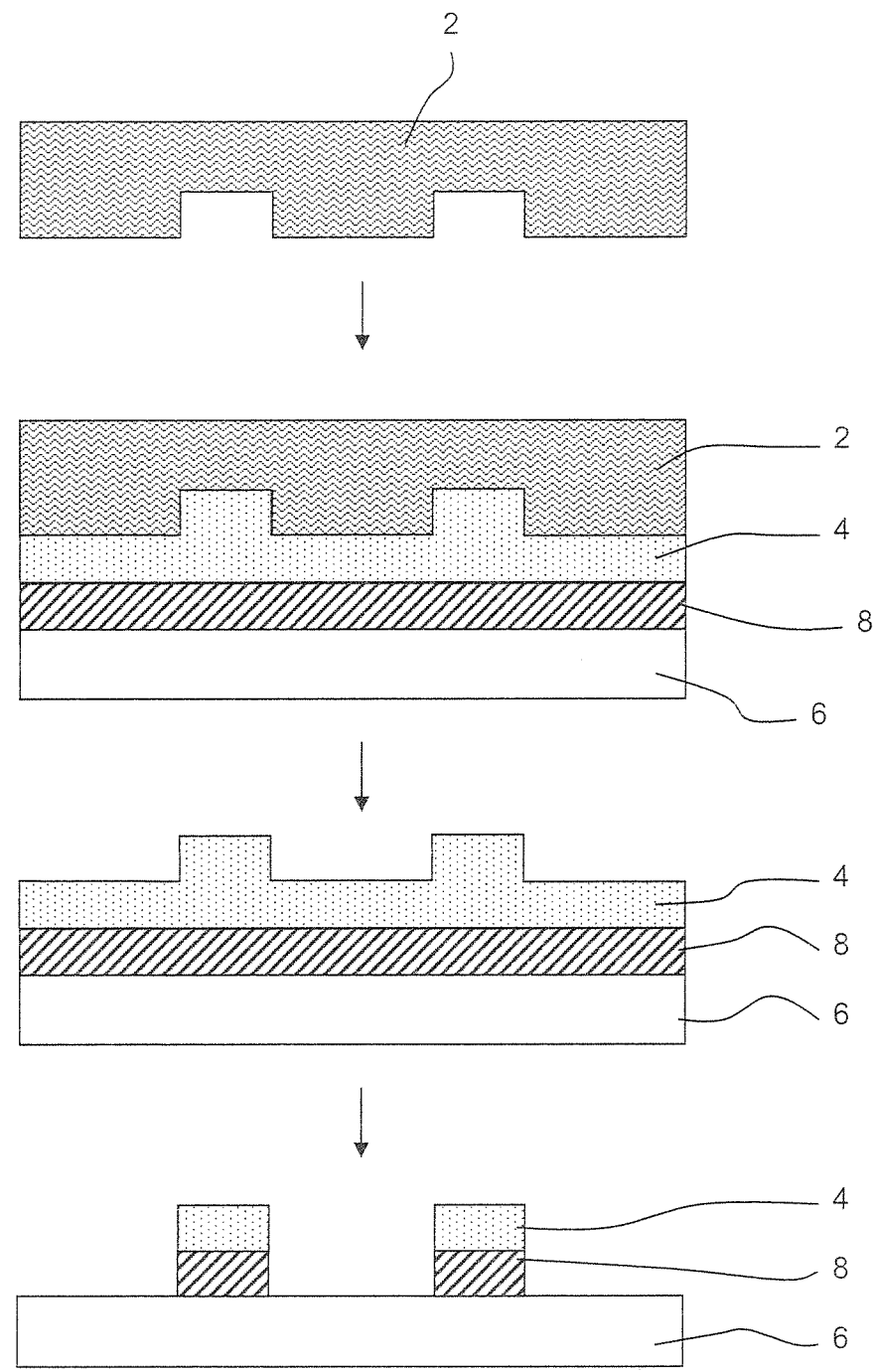
FIGS. 1a and 1b schematically depict examples of, respectively, hot imprint, and UV imprint lithography.
Figure 1B:
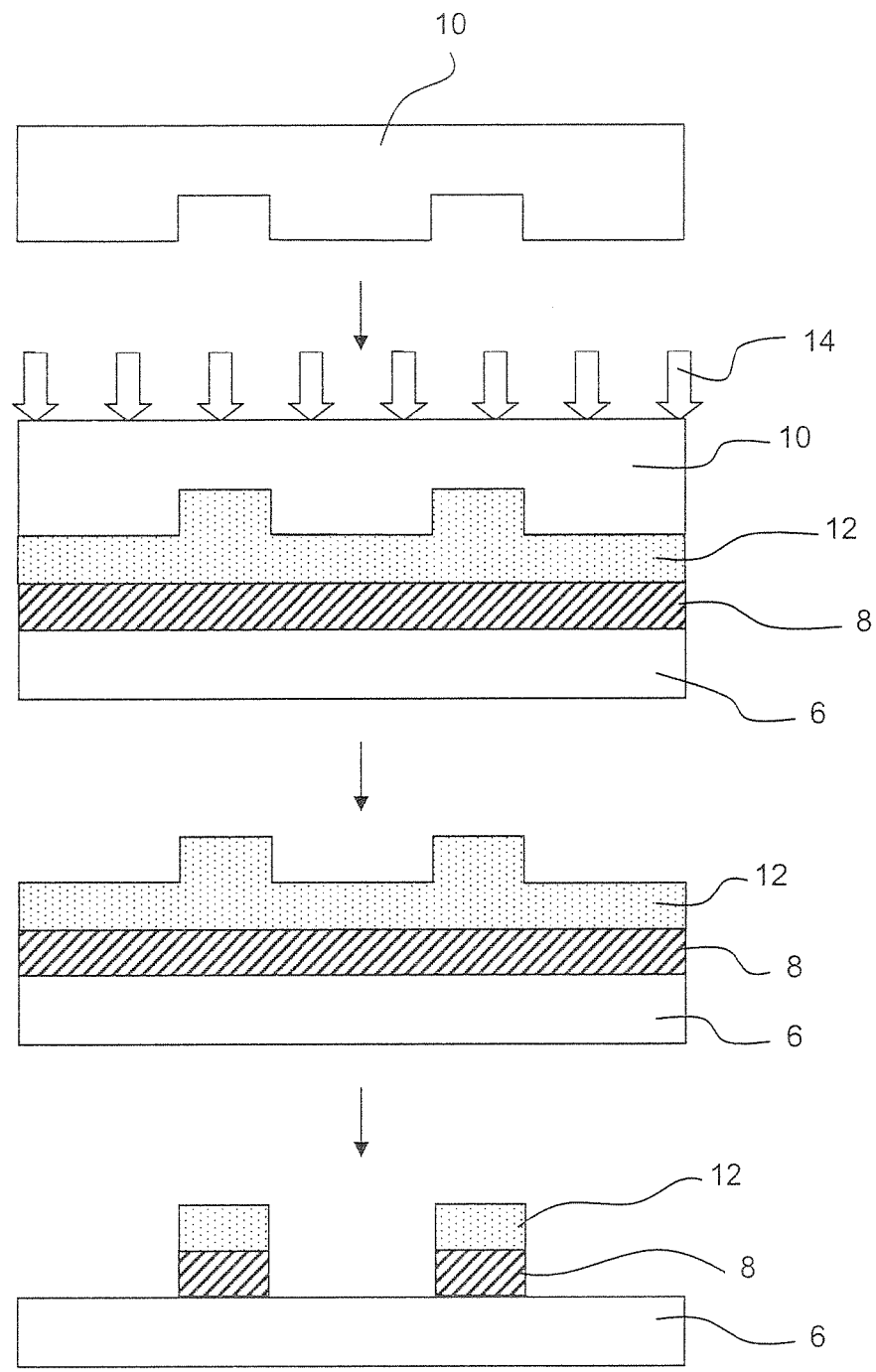

Examples of two known approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin may be, for instance, spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1a. However, instead of using heat or temperature cycling as in hot imprint, the pattern is "frozen" by curing the imprintable medium with UV radiation 14 that is applied through the quartz template onto the imprintable medium. After removal of the template, the pattern will consist of the features in relief from a residual layer of the resin which may then be removed by an appropriate etch process to leave only the pattern features. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. 2005-0274693, which mentions a combination of heating and UV curing an imprintable medium.

During or before an imprint template is imprinted into imprintable medium, it may be desirable to at least partially deform the imprint template. Such deformation may be desirable to, for example, take into account thermal deformation of the imprint template or to make a magnification correction or the like.

Figure 2:
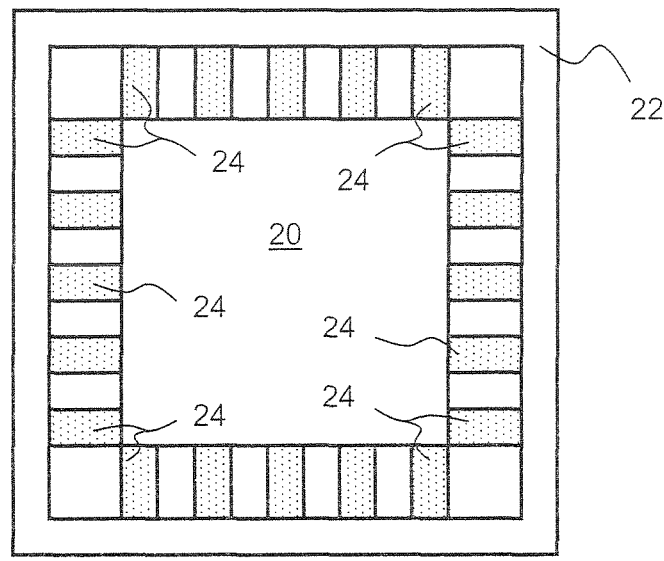
FIG. 2 schematically depicts an arrangement to deform an imprint template, the arrangement comprising actuators of a first type.

FIG. 2 schematically depicts an arrangement to deform an imprint template. An imprint template 20 is shown. Surrounding the imprint template 20 is an actuator support structure 22. The actuator support structure 22 supports a plurality of actuators 24 which extend from the actuator support structure 22 and into contact with a peripheral side of the imprint template 20. The actuators 24 may be, for example, piezoelectric actuators or the like. One or more of the actuators 24 may be activated to push against or pull a part of the imprint template 20 to cause appropriate deformation of the imprint template 20.

FIG. 2 is described as being an arrangement to deform an imprint template. As with all other embodiments described herein, the actuators of the arrangements may alternatively or additionally be used to hold (e.g. clamp) the imprint template or move (e.g. change the position of the imprint template. The actuators may deform, move or hold the imprint template directly. Alternatively, the actuators may move, hold or deform an imprint template holder which, in use, holds an imprint template in order to move, hold or deform that imprint template. In general terms, the arrangements described herein may be used to hold, move or deform an imprint template arrangement, the imprint template arrangement being an imprint template, or an imprint template holder, or an imprint template holder that is holding an imprint template.

Figure 3:
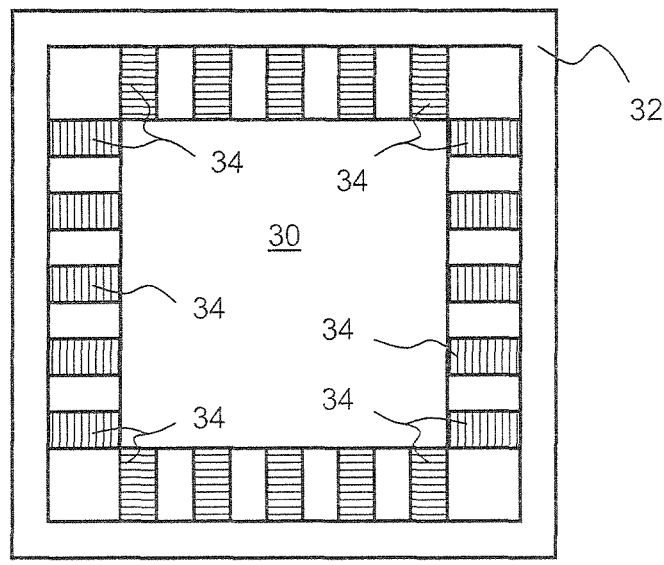
FIG. 3 schematically depicts another arrangement to deform an imprint template, the arrangement comprising actuators of a second type.

FIG. 3 schematically depicts another arrangement to deform an imprint template. An imprint template 30 is shown. Surrounding the imprint template 30 is an actuator support structure 32. The actuator support structure 32 supports a plurality of actuators 34 which extend from the actuator support structure 32 and into contact with a peripheral side of the imprint template 30. The actuators 34 may be, for example, screw thread arrangements or the like. One or more of the actuators 34 may be activated to push against or pull a part of the imprint template 30 to cause appropriate deformation of the imprint template 30.

FIGS. 2 and 3 are now referred to in combination. The actuators 24 of FIG. 2 are of a first type. The actuators 34 of FIG. 3 are of a second, different type. Specifically, the actuators 34 of FIG. 3 have a range of movement which is greater than a range of movement of the actuators 24 of FIG. 2.

The actuators 24 of FIG. 2 have a shorter range of movement. However, the movement may be controlled more accurately and the force which the actuators 24 apply to the imprint template 20 may also be controlled more accurately. Due to the limited range of motion of the actuators 24, it may be difficult to, for example, quickly and easily load and unload the imprint template 20. Alternatively or additionally, it may be difficult or impossible to move or deform the imprint template 20 to a desired extent.

FIG. 3 shows actuators 34 which have an increased range of motion. The increased range of motion of the actuators 34 may allow larger forces to be applied to the imprint template 30 or larger positional changes to be implemented. However, due to the large range of motion of the actuators 30, it may be difficult to accurately apply a desired force or change in position.

It is desirable to provide an arrangement to deform, move or hold an imprint template which has an advantage of actuators which have a short range of motion, and an advantage of actuators having a longer range of motion, but, for example, few or none of the problems associated with the use of a given single type of actuator.

According to an embodiment of the present invention, an imprint lithography apparatus is provided which comprises a support structure arranged to support an imprint template arrangement (e.g. an imprint template, an imprint template holder, or an imprint template holder that is holding an imprint template). A first actuator (or plurality of first actuators) is attached to the support structure and arranged in use to extend between the support structure and the imprint template arrangement. The first actuator is therefore capable of applying a force to the imprint template arrangement. A second actuator (or plurality of second actuators) is also provided. The second actuator is attached to the support structure, and arranged in use to extend between the support structure and the imprint template arrangement. The second actuator is therefore capable of applying a force to the imprint template arrangement. A range of motion of the second actuator is greater than a range of motion of the first actuator. The difference in the ranges of motions of the first and second actuators means that an advantage of the use of each actuator in isolation is present, whereas few or none of the disadvantages are present.

Figure 4:
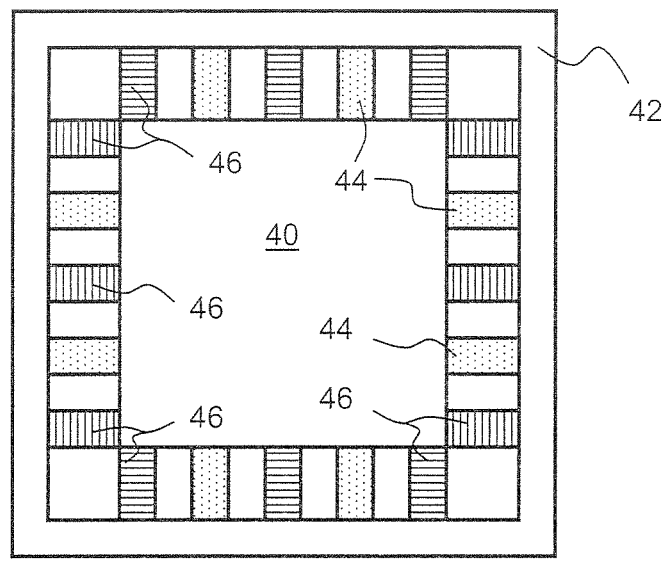
FIG. 4 schematically depicts an arrangement to deform an imprint template in accordance with an embodiment of the present invention.

FIG. 4 schematically depicts an arrangement to deform an imprint template in accordance with an embodiment of the present invention. An imprint template 40 is shown. Surrounding the imprint template 40 is an actuator support structure 42. The actuator support structure 42 supports a plurality of first actuators 44 and a plurality of second actuators 46. The actuators 44, 46 extend from the actuator support structure 42 and into contact with a peripheral side (or edge or face, which are all taken to mean substantially the same part) of the imprint template 40. The range of movement of the second actuators 46 is greater than a range of movement of the first actuators 44. With this limitation, the first actuator and/or second actuator may be one of a piezoelectric actuator, a pneumatic actuator, a hydraulic actuator, an electromagnetic actuator, a voice coil, or a screw thread arrangement (e.g. anything with a screw thread, such as a screw, a bolt, a screw spindle, or the like).

The actuators 44, 46 extend between the actuator support structure 42 and the imprint template 40. The actuators 44, 46 could, in other embodiments, also extend through the support structure 42. Along any given side of the imprint template 40, the first actuators 44 and second actuators 46 may be disposed alongside one another in a parallel configuration. This means that along any one given side of the imprint template 40, the actuators 44, 46 are extendable or moveable in the same parallel direction.

The actuators 44, 46 may be used to apply a force to a peripheral side of the imprint template 40 to hold, to deform or move (e.g. change the position of) the imprint template 40. In order to achieve accurate control of the holding, moving or deforming, first actuators 44 may be provided on opposite sides of the support structure 42 to meet opposite sides of the imprint template 40. Similarly, second actuators 46 may be provided on opposite sides of the support structure 42 to meet opposite sides of the imprint template 40. In FIG. 4, the first actuators 44 and second actuators 46 are located in positions on the support structure 42 which, in use, surround the imprint template 40. In other embodiments, the actuators 44, 46 may extend along only one or more sides of the imprint template 40. One side of the imprint template may be supported by a rigid support or wall or the like, actuators on an opposite side of the imprint template to the wall being arranged to push against the imprint template to deform or hold the imprint template.

Figure 5:
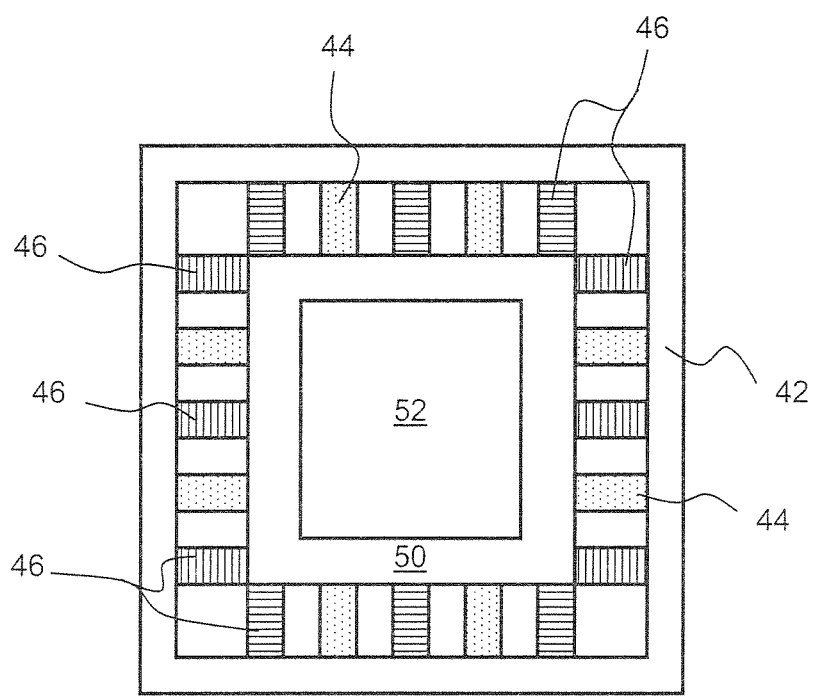
FIG. 5 schematically depicts an arrangement to deform an imprint template holder in accordance with an embodiment of the present invention.

As discussed above, the arrangement shown in FIG. 4 may be used to, hold, move or deform an imprint template. The arrangement shown in FIG. 4 may be used to, in general, hold, move or deform an imprint template arrangement, which may be an imprint template (as shown in FIG. 4) or an imprint template holder which may, in use, hold an imprint template. FIG. 5 schematically depicts another embodiment of the present invention. In FIG. 5, the actuator arrangement of FIG. 4 is used to support an imprint template holder 50. The imprint template holder 50 is shown as holding an imprint template 52. The imprint template 52 may therefore be held, moved or deformed by appropriate holding, deformation or movement of the imprint template holder 50.

By combining the use of second actuators and first actuators, where the range of movement of the second actuators is greater than the range of movement of the first actuators, one or more advantages may be obtained. For instance, the second actuators may be, for example, pneumatic actuators. Pneumatic actuators may provide a high force desired to, for example, impart a magnification correction by deforming the imprint template. However, pneumatic actuators are, in general, flexible along their longitudinal axis. Therefore, pneumatic actuators may not be useful for accurate position control. The first actuators may, for example, be voice coils. Voice coils are well suited for positioning, since the force which they apply can be controlled with a high degree of accuracy. However, they are not well suited for providing a magnification correction, because in order to apply a high force with a voice coil, a high heat load would be provided in the region of the imprint template contacted by the voice coil, and this heat could undesirably deform the imprint template. However, by combining both these types of actuators (e.g. voice coils and pneumatic actuators) an individual disadvantage associated with each type of actuator may be overcome. The pneumatic actuators can be used to exert high forces on the imprint template, whereas the voice coils can be used to exert small, but precise, forces on the imprint template. The voice coils can therefore be used to fine tune the force applied by the pneumatic actuators, or to make small changes to the shape or position of the imprint template. The voice coils do not need to apply a large force to the imprint template, therefore avoiding the high heat load problems associated with such high forces.

In another example, the second actuators, having a greater range of movement than the first actuators, may be screw thread arrangements. A screw thread arrangement is advantageous because, when in position, no energy input is required to keep the screw thread in position. High forces can be applied to the imprint template using the screw thread arrangement. However, it is difficult to achieve highly accurate control of the forces applied by the screw thread. The first actuators, having a range of movement smaller than the range of movement of the screw thread arrangement, may be for example, piezoelectric actuators. The piezoelectric actuators can be used to fine tune the force applied by the screw thread arrangement, or to undertake small changes to the shape or position of the imprint template, which would be difficult or impossible to undertake with the screw thread arrangement in isolation.

Figure 6:
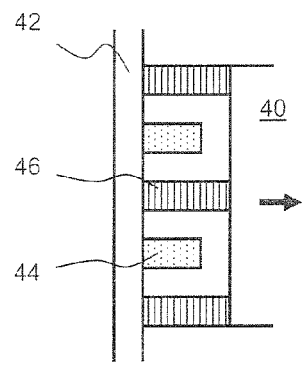
FIG. 6 schematically depicts a problem associated with the holding, moving or deforming of an imprint template using actuators disposed along a side of the imprint template.
Figure 7:
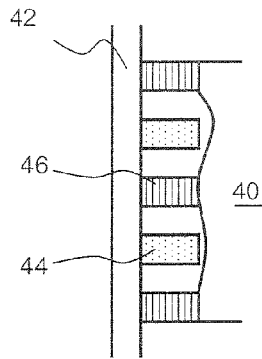
FIG. 7 schematically depicts another problem associated with the holding, moving or deforming of an imprint template using actuators disposed along a side of the imprint template.

FIGS. 6 and 7 schematically depict a problem which may arise during use of the arrangement shown in and described with reference to FIG. 4. The problems are, in general, equally applicable to the arrangement shown in FIG. 5. Referring to FIG. 6, the second actuators 46 have been controlled to move the imprint template 40 away from the actuator support structure 42. In doing so, the first actuators 44 are no longer in contact with the imprint template 40, and can therefore not be used to hold, deform or move the imprint template 40. FIG. 7 depicts a different, but related problem. In FIG. 7, the imprint template 40 is shown as being in contact with the second actuators 46. However, due to imperfections in the manufacture of the imprint template 40, a side of the imprint template 40 is not flat, but instead comprises undulations. These undulations result, in this instance, in the first actuators 44 not being in contact with this side of the imprint template 40. This means that the first actuators cannot be used to, for example, move, hold, or deform the imprint template 40.

In order to overcome one or more of the problems illustrated with FIGS. 6 and 7 or any other not described herein, it may be possible to activate the first actuators 44 to extend or move the first actuators 44 towards the imprint template 40, and bring the actuators 44 into contact with the imprint template 40. However, such activation to achieve such movement or extension may take up a valuable part of the range of movement of the first actuator 44. This may mean that there is little or no further extension or movement possible to hold, deform or move the imprint template 40. In an alternative solution, an actuator positioning arrangement may be provided to position the first actuators 44 (or even the second actuators 46). The first actuators 44 may be positioned by, for example, moving the first actuators 44 towards and into contact with the imprint template 40. This may be achieved without any activation of the first actuators 44, meaning that no range of motion of each first actuator 44 is lost during and after movement of the first actuator 44. The full range of motion of the first actuator 44 is therefore available to hold, move or deform the imprint template 40.

Figure 8:
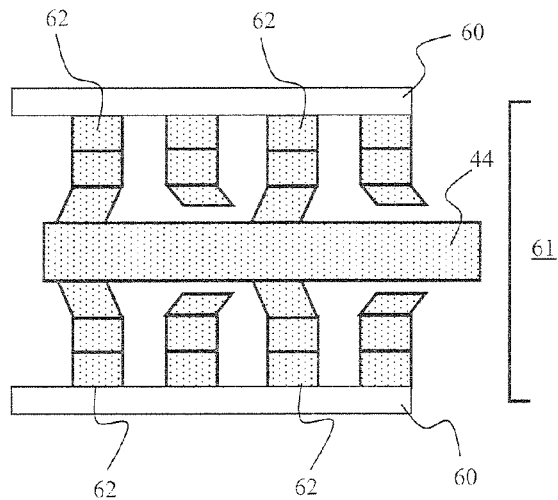
FIG. 8 schematically depicts an actuator positioning arrangement.

FIG. 8 schematically depicts a side on view of an arrangement to position an actuator. The arrangement comprises a support structure 60 which may fully or partially surround an imprint template arrangement 61. Extending from different sides of that support structure 60 are a plurality of positioning actuators 62. The positioning actuators 62 support a first actuator 44 (e.g. a first actuator 44 as described previously). The first actuator 44 extends through the support structure 60. The positioning actuators 62 may be used to selectively clamp and move the first actuator 44 in a continuous or step-wise manner. The positioning actuators 62 may be used to, for example, position the first actuator 44 adjacent to or in contact with an imprint template arrangement 61.

The positioning actuators 62 may be, for example, piezoelectric elements, which can be controlled with a high degree of accuracy. Other actuators may be used. The first actuator 44 may be a piezoelectric element, which can be controlled with a high degree of accuracy. Other actuators may be used. Clamping and movement of the first actuator 44 may be achieved by the application of appropriate electric fields across one or more components of the positioning actuators 62 to control the orientation or extent of one or more parts of the positioning actuators 62 in one or more dimensions.

In another example (not shown), the positioning actuators may not clamp the first actuator 44. Instead, the first actuator may sit on positioning actuators located below the first actuator (e.g. the lower plurality of positioning actuators in FIG. 8). The positioning actuators may be selectively activated to move the first actuator.

Figure 9:
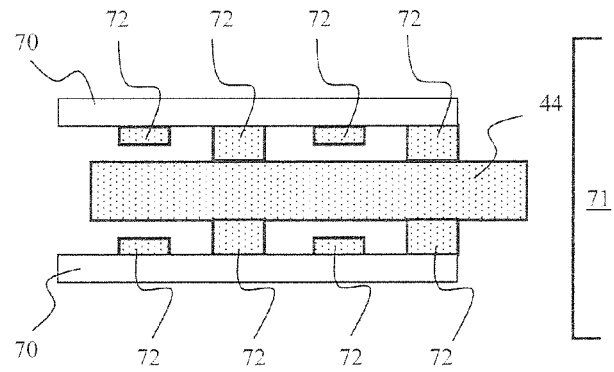
FIG. 9 schematically depicts another actuator positioning arrangement.

FIG. 9 schematically depicts another arrangement to position an actuator. Shown in side-on view, the arrangement comprises a support structure 70 which may fully or partially surround an imprint template arrangement 71. Extending from different sides of that support structure 70 is a plurality of positioning actuators 72. The positioning actuators 72 support a first actuator 44 (e.g. a first actuator 44 as described previously). The first actuator 44 extends through the support structure 70. The positioning actuators 72 are selectively controlled to clamp or release a portion of first actuator 44. A portion of the first actuator 44 may be clamped by one or more of the positioning actuators 72. The first actuator 44 may be controlled to expand. Further positioning actuators 72 may then clamp a different portion of the first actuator 44, and previously clamping positioning actuators 72 can then be unclamped allowing a portion of the first actuator 44 to move between the positioning actuators 72. This process can be repeated to move the first actuator 44 in a step-wise manner in-between the positioning actuators 72 and, for example, position the first actuator 44 adjacent to or in contact with the imprint template arrangement 71.

The positioning actuators 72 may be piezoelectric elements, which can be controlled with a high degree of accuracy. Other actuators may be used. The first actuator 44 may be a piezoelectric element, which can be controlled with a high degree of accuracy. Other actuators may be used. Clamping and movement of the first actuator 44 may be achieved by the application of appropriate electric fields across one or more components of the positioning actuators 72 to control the orientation or extent of one or more parts of the positioning actuators 72 in one or more dimensions.

The arrangements shown in FIGS. 8 and 9 may be used to position one or more actuators relative to an imprint template arrangement. Even though the movement of only a single actuator is depicted, more than one actuator can be moved. If the actuators are in contact with and/or attached to the imprint template arrangement, the arrangements shown in FIGS. 8 and 9 can alternatively or additionally be used to position the imprint template arrangement.

The positioning actuators shown in FIGS. 8 and 9 may move only a first actuator, or a body of material or the like to which the first actuator is attached, or of which the first actuator forms a part. The positioning actuators shown in FIGS. 8 and 9 may support and be actuable to move a plurality of actuators, for example a first actuator attached to one or more further actuators. The further actuators may be used to assist in the movement of the first actuator, for example by appropriate expansion of compression of one or more of the further actuators. A plurality of positioning actuators may be provided, the plurality of positioning actuators extending from one or more sides or parts (or different sides or parts) of the support structure to support the first actuator. The support structure may fully or partially surround the imprint template arrangement. A plurality of positioning actuators may be attached to the support structure, and be located such that the plurality of positioning actuators extend along one or more sides of the imprint template arrangement. The one or more positioning actuators may be one of: a piezoelectric actuator, a pneumatic actuator, a hydraulic actuator, an electromagnetic actuator, a voice coil or a screw thread arrangement, and/or the first actuator may be one of: a pneumatic actuator, a hydraulic actuator, an electromagnetic actuator, a voice coil or a screw thread arrangement.

The movement or extension of the second actuators 46 to hold, deform or move the imprint template may be undertaken in an environment (e.g. an enclosure or a station) which is remote from the environment (e.g. enclosure or station) in which imprinting of the imprint template is undertaken. This is because the movement or extension of the second actuators may cause particles or debris the like to be dislodged from the actuator, which could contaminate the medium into which the imprint template is to be imprinted. The first actuators 44 may be activated in the same environment (e.g. enclosure or station) in which imprinting of the imprint template is undertaken, since the movement of extension of the first actuators is less likely to generate contamination.

The forces that need to be applied to an imprint template arrangement to deform the imprint template arrangement may be quite different to the forces required to move the imprint template arrangement. In general, the forces required to deform the imprint template arrangement (e.g. to compensate for a magnification anomaly) will be significantly higher than the forces required to move the imprint template arrangement (e.g. to align the imprint template arrangement). Any small fluctuations (e.g. noise) in the forces applied to the imprint template arrangement to deform the imprint template arrangement will therefore be present as large fluctuations in the forces required to move the imprint template arrangement. These large fluctuations can result in inaccurate alignment of the imprint template arrangement. A solution of this problem would be to reduce the control bandwidth for the deformation of the imprint template arrangement relative to the control bandwidth for the movement of the imprint template arrangement. This will result in a reduction of the inaccuracies in the movement (e.g. alignment) of the imprint template arrangement. The reduction in the control bandwidth for the deformation of the imprint template arrangement will result in the deformation being implemented more slowly. However, the deformation can still be undertaken quickly enough to ensure that the imprint template arrangement has the desired deformation before, for example, imprintable medium in which the imprint template arrangement is imprinted is cured.

Figure 10:
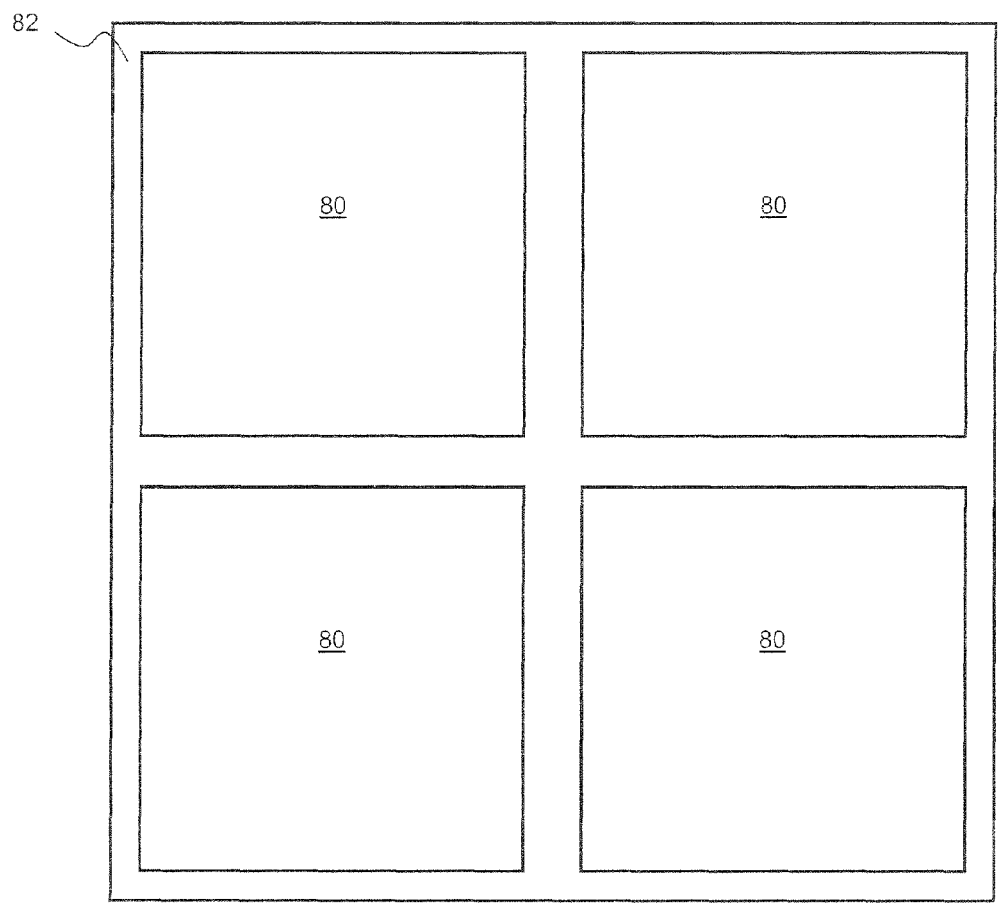
FIG. 10 schematically depicts a support structure arranged to support a plurality of imprint template arrangements.

In the above-described embodiments, the support structure has been described as supporting an imprint template arrangement. Each support structure depicted has been shown as holding a single imprint template arrangement. In some applications, it is desirable to use a plurality of imprint template arrangements (e.g. a plurality of imprint templates) simultaneously or in parallel in order to improve the throughput of an imprint lithography process or method. FIG. 10 schematically depicts four imprint templates 80 held rigidly in position by a support structure 82. This means that the imprint templates 80 cannot be moved relative to the support structure 82. The support structure 82 may be moveable to position the imprint templates 80 relative to, for example, a substrate into which the pattern is to be imprinted. However, it is desirable to provide a more versatile support structure capable of supporting a plurality of imprint templates.

According to an embodiment of the present invention, there is provided a support structure arranged to support a plurality of imprint templates. A first imprint template actuator is attached to the support structure, and is arranged in use to extend between the support structure and the first imprint template. The first actuator is configured to apply a force to the first imprint template to hold the first imprint template, move the first imprint template, or deform the first imprint template. A second imprint template actuator is also provided and is attached to the support structure. In use, the second imprint template actuator extends between the support structure and the second imprint template. The second imprint template actuator is configured to apply a force to the second imprint template, and therefore allows the second imprint template to be held, moved or deformed. The support structure may extend along or surround one, more or all sides of each imprint template.

By providing one or more actuators for the first imprint template, and one or more actuators for the second imprint template, the holding, movement or deformation of the first imprint template can be controlled independently of that of the second imprint template. This makes the support structure as a whole more versatile than existing support structures for supporting a plurality of imprint templates. An advantage is the ability to hold, move or deform each imprint template independently of any other imprint template, such that more accurate holding, movement or deformation of each imprint template may be achieved. This may improve the accuracy of the imprinting of patterns into a substrate or the like, and this may improve yield or throughput.

Figure 11:
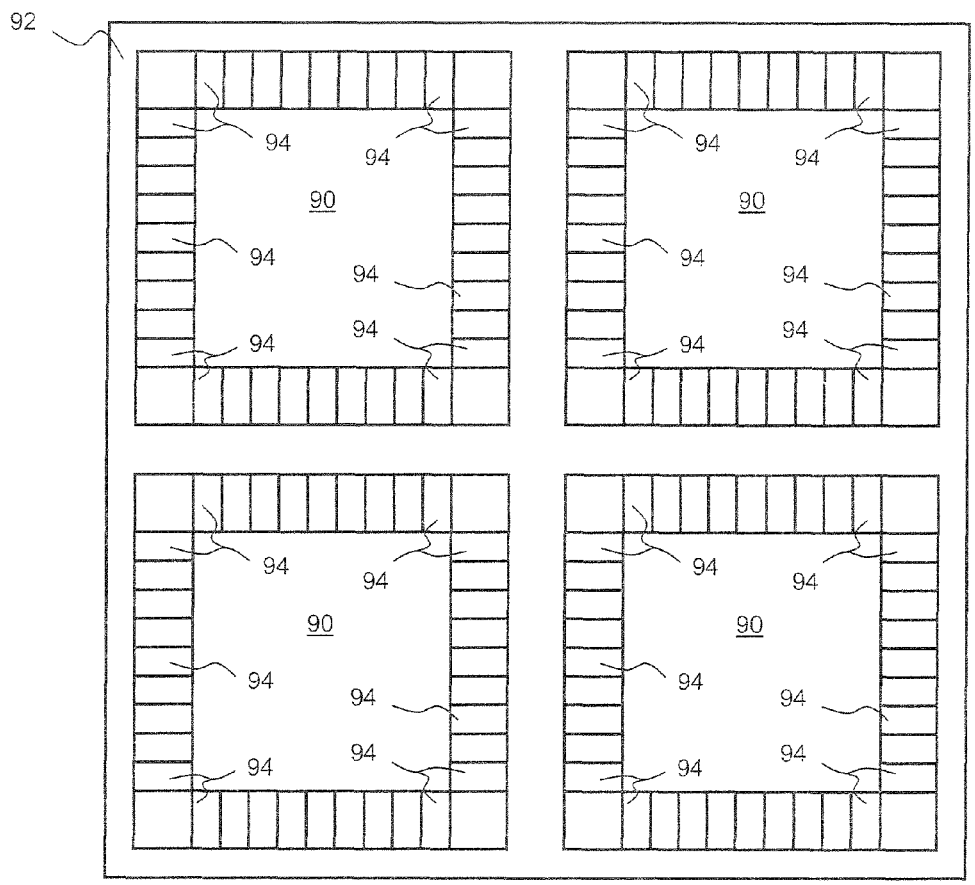
FIG. 11 schematically depicts a support structure arranged to support a plurality of imprint template arrangements, in accordance with an embodiment of the present invention.

FIG. 11 depicts an arrangement to support a plurality of imprint template arrangements in accordance with an embodiment of the present invention. Four imprint template arrangements 90 are shown as being disposed adjacent to one another. The imprint template arrangement 90 could be, for example, an imprint template, an imprint template holder or an imprint template holder that is holding an imprint template. Surrounding each and all of the imprint template arrangements 90 is an actuator support structure 92. The actuator support structure 92 supports a plurality of actuators 94 which extend from the actuator support structure 92 and into contact with a peripheral side of each imprint template 90. The actuators 94, may be, for example, piezoelectric actuators or the like. One or more of the actuators 94 may be activated to push against or pull a part of one or more of the imprint templates 90 to cause appropriate deformation, movement or holding of the respective imprint template 90. Actuators 94 surrounding any particular imprint template arrangement 90 may be activated independently of actuators 94 surrounding any other particular imprint template arrangement 90. This allows the holding, moving or deforming of any imprint template arrangement 90 to be undertaken independently of the holding, moving or deforming of another imprint template arrangement 90.

The actuators 94 surrounding the imprint templates 90 may all be of the same type and/or may all have the same ranges of motion. In other embodiments, the actuators 94 may comprise one or more first actuators and one or more second actuators, the range of movement of the second actuators being greater than a range of movement of the first actuators. An advantage of such an arrangement is described above. The first and second actuators may be arranged in parallel, as discussed above, or in series. In a series arrangement, the first and second actuators may be arranged adjacent to one another in a linear manner.

More than two imprint template arrangements may be supported. Further imprint template arrangement actuators may be attached to the support structure, and arranged in use to extend between the support structure and the additional imprint template arrangements. For example, four imprint template arrangements may be supported.

In an embodiment, a first support structure may surround an imprint template and a first or second actuator may extend between the first support structure and the imprint template. A second support structure may surround both the first support structure and the imprint template, and the first or second actuators may extend between the second support structure and the first support structure to form the series arrangement.

The actuators can be any suitable actuators and may be, for example, piezoelectric actuators, magnetic actuators, hydraulic actuators, electromagnetic actuators, voice coils, screw thread arrangements, or the like. The actuators may fully or partially surround each respective imprint template. For instance, the actuators may extend along a single side of the imprint template, or along opposite sides of an imprint template.

In the above described embodiments, the actuators may be individually controllable. This means that the force applied by any actuator can be controlled independently of the force applied by any other actuator, leading to more accurate holding, moving or deformation of the imprint template arrangement.

An embodiment of the present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, etc.

In an above embodiment, an imprint lithography apparatus has been described which comprises: a support structure arranged to support an imprint template arrangement; a first actuator attached to the support structure, and arranged in use to extend between the support structure and the imprint template arrangement; and a second actuator attached to the support structure, and arranged in use to extend between the support structure and the imprint template arrangement, the second actuator configured to apply a force to the imprint template arrangement, a range of movement of the second actuator being greater than a range of movement of the first actuator. In other embodiments, the first actuator may not be attached to the support structure, but could for example be attached to another structure. The first actuator may not extend between the support structure and the imprint template arrangement, but may instead extend into contact with the imprint template arrangement from any convenient location or position (for example a base of the imprint lithography apparatus or support structure).

In the above embodiments, a plurality of actuators has been shown as surrounding the imprint template arrangement. In other embodiments, two or more rows of actuators may extend along one or more sides of the imprint template arrangement. The rows of actuators, or actuators within that row, may be selectively engaged to cause deformation of the imprint template arrangement. For instance, a first row of actuators may be disposed on an opposite side of a neutral plane of the imprint template arrangement to a second row of actuators. The application of force to the imprint template arrangement on a specific side of the neutral plane can be used to cause bending of the imprint template arrangement. The imprint template arrangement may be bent to make it easier and quicker to imprint an imprint template into an imprintable medium, and/or to release the imprint template from that medium.

The described and illustrated embodiments are to be considered as illustrative and not restrictive in character, it being understood that only embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An arrangement suitable for use in an imprint lithography apparatus, the arrangement comprising:
    a support structure arranged to support an imprint template arrangement;
    a first actuator configured to apply a force to the imprint template arrangement in a first direction; and
    a second actuator attached to the support structure, and arranged in use to extend between the support structure and the imprint template arrangement, the second actuator configured to apply a force to the imprint template arrangement in a second direction substantially parallel to the first direction, a range of movement of the second actuator being greater than a range of movement of the first actuator.

2. The arrangement of claim 1, wherein the first actuator is attached to the support structure, and arranged in use to extend between the support structure and the imprint template arrangement.

3. The arrangement of claim 1, wherein the first actuator and second actuator are arranged in use to be disposed along at least one side of the imprint template arrangement, and wherein the first actuator and second actuator are disposed alongside each other in a parallel configuration.

4. The arrangement of claim 1, wherein the first and/or second actuator is arranged to apply a force to a peripheral side of the imprint template arrangement.

5. The arrangement of claim 1, wherein:
    another first actuator is provided on an opposite side of the support structure to meet an opposite side of the imprint template arrangement; and/or
    another second actuator is provided on an opposite side of the support structure to meet an opposite side of the imprint template arrangement.

6. The arrangement of claim 1, wherein:
    the first actuator is one of a plurality of first actuators, and/or
    the second actuator is one of a plurality of second actuators.

7. The arrangement of claim 6, wherein:
    the plurality of first actuators and/or second actuators are located in positions on the support structure which, in use, surround the imprint template arrangement, or extend along one or more sides of the imprint template arrangement.

8. The arrangement of claim 1, wherein the first actuator is one selected from the group comprising: a piezoelectric actuator, a pneumatic actuator, a hydraulic actuator, an electromagnetic actuator, a voice coil, or a screw thread arrangement.

9. The arrangement of claim 1, wherein the second actuator is one selected from the group comprising: a piezoelectric actuator, a pneumatic actuator, a hydraulic actuator, an electromagnetic actuator, a voice coil, or a screw thread arrangement.

10. The arrangement of claim 1, wherein the support structure is arranged to surround the imprint template arrangement.

11. The arrangement of claim 1, further comprising an actuator positioning arrangement configured to position the first actuator or the second actuator.

12. The arrangement of claim 11, wherein the actuator positioning arrangement comprises one or more selected from the group comprising: a piezoelectric element, a pneumatic actuator, a hydraulic actuator, an electromagnetic actuator, a voice coil, or a screw thread arrangement.

13. The arrangement of claim 1, wherein the imprint template arrangement is an imprint template, an imprint template holder, or an imprint template holder that is holding an imprint template.

14. An imprint lithography apparatus comprising the arrangement of claim 1.

15. An arrangement suitable for use in an imprint lithography apparatus, the arrangement comprising:
    a support structure arranged to support a first imprint template arrangement and a second imprint template arrangement;
    a first imprint template arrangement actuator attached to the support structure, and arranged in use to extend between the support structure and the first imprint template arrangement, the first imprint template arrangement actuator configured to apply a force to the first imprint template arrangement in a first direction;
    a second imprint template arrangement actuator configured to apply a force to the second imprint template arrangement in a second direction substantially parallel to the first direction; and
    a third imprint template arrangement actuator attached to the support structure, and arranged in use to extend between the support structure and the second imprint template arrangement, the second imprint template arrangement actuator configured to apply a force to the second imprint template arrangement in a third direction substantially parallel to the first direction, a range of movement of the third imprint template arrangement actuator being different than a range of movement of the second imprint template arrangement actuator.

16. The arrangement of claim 15, wherein a plurality of first imprint template arrangement actuators are arranged in use to extend along at least one side of the first imprint template arrangement, and/or wherein a plurality of third imprint template arrangement actuators are arranged in use to extend along at least one side of the second imprint template arrangement.

17. The arrangement of claim 15, wherein a plurality of first imprint template arrangement actuators are arranged in use to surround the first imprint template arrangement, and/or wherein a plurality of third imprint template arrangement actuators are arranged in use to surround the second imprint template arrangement.

18. The arrangement of claim 15, wherein the first imprint template arrangement actuator, and/or the third imprint template arrangement actuator, is one selected from the group comprising: a piezoelectric actuator, a pneumatic actuator, a hydraulic actuator, an electromagnetic actuator, a voice coil, or a screw thread arrangement.

19. The arrangement of claim 15, further comprising an actuator positioning arrangement configured to position the first imprint template arrangement actuator or the third imprint template arrangement actuator.

20. The arrangement of claim 15, wherein the support structure is arranged to surround the first imprint template arrangement and the second imprint template arrangement.

\* \* \* \* \*